Sept. 10, 1968 R. J. HUGHES 3,401,353
AUTOMATIC COARSE TUNING SYSTEM FOR A FREQUENCY SYNTHESIZER
Filed July 6, 1967 2 Sheets-Sheet 1

INVENTOR.
RICHARD J. HUGHES
BY
Edward J. Eckman
AGENT

Sept. 10, 1968 R. J. HUGHES 3,401,353

AUTOMATIC COARSE TUNING SYSTEM FOR A FREQUENCY SYNTHESIZER

Filed July 6, 1967 2 Sheets-Sheet 2

INVENTOR.
RICHARD J. HUGHES

BY Edward J. Coleman
AGENT

United States Patent Office 3,401,353

Patented Sept. 10, 1968

3,401,353

AUTOMATIC COARSE TUNING SYSTEM FOR A FREQUENCY SYNTHESIZER

Richard J. Hughes, Williamsville, N.Y., assignor to Sylvania Electric Products Inc., a corporation of Delaware Filed July 6, 1967, Ser. No. 651,618
8 Claims. (Cl. 331—11)

ABSTRACT OF THE DISCLOSURE

In an indirect digital frequency synthesizer including a voltage controlled oscillator having a feedback loop connected from its pulse output to its phase control input via a frequency divider, phase detector and low pass filter, a circuit for coarse tuning the oscillator to within a frequency range allowing the phase detector to accomplish phase lock of a feedback pulse train, with the pulse train from a reference frequency source. The coarse tuning circuit comprises a digital network for comparing the feedback pulses with the reference pulse train in a manner to generate output pulses when the feedback pulses are not interlaced in time with the reference pulses in an alternating one-to-one manner, and to provide no pulse output when the feedback and reference signals are so interlaced. These output pulses are applied to a binary counter and thence to a digital to analog converter connected at the output of the counter to provide a frequency error correction signal in the form of a staircase waveform for application to a control element of the oscillator. The digital comparator comprises a pair of pulse generators through which the feedback and reference pulse trains are respectively applied, a pair of flip-flops controlled by the outputs from the pulse generators, and an arrangement of logic gates controlled by the flip-flops for inhibiting or allowing output pulses from the pulse generators.

*Background of the invention*

Figure 1:
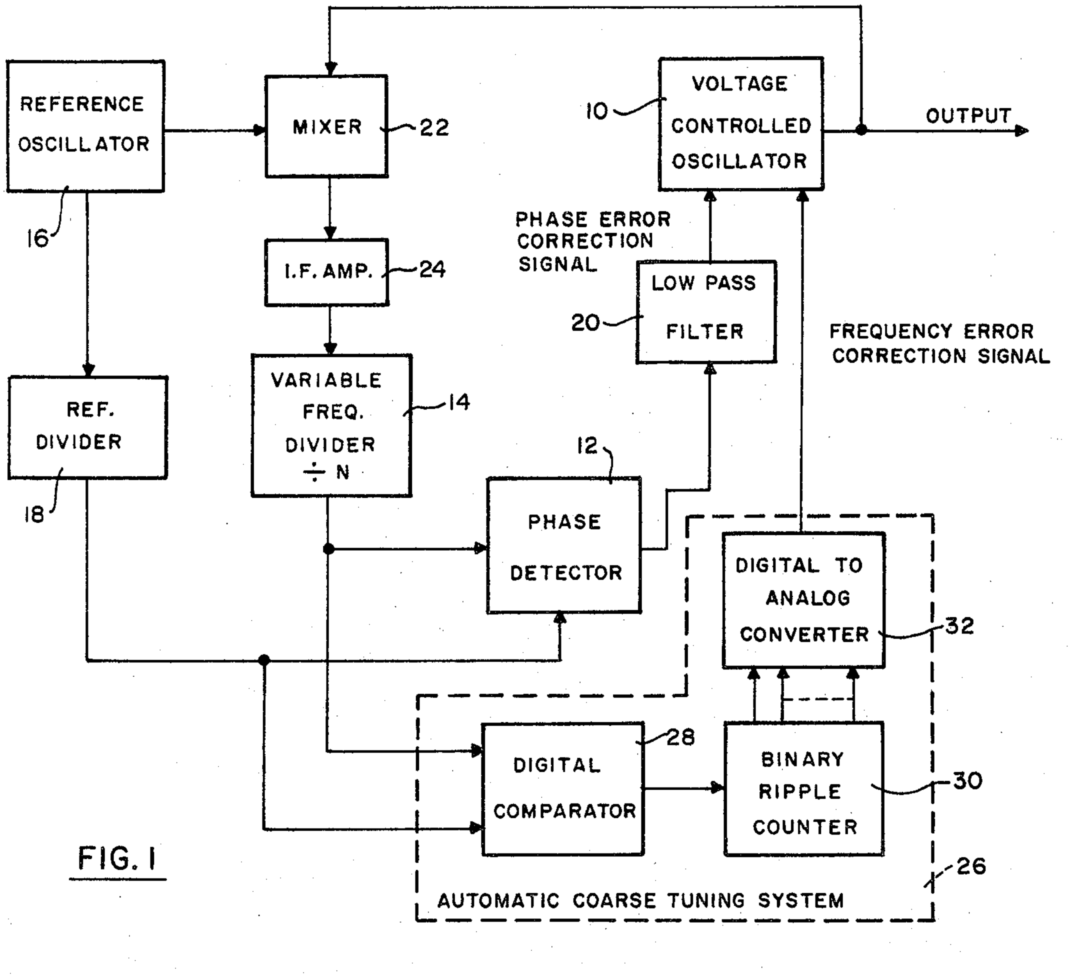

This invention relates in general to frequency control circuits and in particular to an improved coarse tuning system for an indirect digital frequency synthesizer.

A typical indirect digital frequency synthesizer comprises a voltage controlled oscillator (VCO) adapted to be controlled in phase and frequency, a digital phase detector, a variable frequency divider in a feedback path from the oscillator pulse output to one input of the phase detector, a reference frequency signal source connected to the other input of the phase detector and a low pass filter connected between the phase detector output and the control element of the oscillator. If there is a phase difference between the reference signal pulse train and the feedback signal pulse train from the divider, the phase detector generates an error signal which is applied via the low pass filter to phase correct the oscillator to achieve phase lock with the reference signal. Different output frequencies are selected by changing the feedback path frequency division ratio.

In addition to the above mentioned elements, the synthesizer requires some means to coarse tune the frequency of the voltage controlled oscillator to within a range that will allow the phase detector to pull the system into phase lock. One conventional coarse tuning technique has been to employ a manually adjusted resistor matrix composed of highly accurate components to provide a frequency error correction voltage to the oscillator control element. Because of the high cost of the accurate matrix components and the need in certain applications for a VCO which is highly stable under all environmental conditions, the manually adjusted resistor matrix has been replaced in many instances by an automatic coarse tuning system which usually takes the form of a digital frequency control loop. Although providing automatic control, these previously employed frequency control loops all suffer from a common drawback; either they are limited to a relatively narrow frequency control range, or they require the use of a wide band divider in the oscillator feedback path, with the attendant disadvantages of higher cost and lower reliability.

For example, one of the prior art coarse tuning systems comprises a time discriminator to which the feedback signal from the variable divider is applied, and a digital to analog converter for providing a frequency error correction signal to a control element in the synthesizer voltage controlled oscillator. The time discriminator consists of a pair of monostable multivibrators and an output logic gate. The timing of the multivibrators is arranged so that when the divider pulse frequency is close to that of the reference frequency, the divider pulse will fall within a "window" period established by one of the multivibrators, this "window" representing the acquisition range of the time discriminator. If the divider pulse falls outside the window," the logic gate will allow the pulse to trigger the digital to analog converter and provide an error signal to the voltage controlled oscillator; in this condition the frequency control loop is out of lock. When the feedback frequency is such that the divider pulse occurs during the "window" period, the logic gate inhibits any further output pulses and the frequency loop has acquired the locked condition, after which the phase detector operates to acquire phase lock. This system has the following immediately apparent disadvantages: timing monostable drift makes the circuit prone to loop error; if the feedback signal disappears, the frequency correction signal will also disappear, and the use of a delay network to provide a "window" limits the speed of loop response. A more significant disadvantage, however, lies in the aforementioned bandwidth limitations. If the voltage controlled oscillator applies ultra high frequency feedback pulses directly to the variable divider, a very high speed digital counter is required to provide the desired frequency division. If the oscillator output frequency were divided down by a fixed divider before being applied to the variable divider, a relatively large number of counter stages would be required to accommodate a large number of channels. If it were attempted to preclude the need for a high speed divider counter and reduce the length of that counter by mixing the oscillator output frequency with a reference frequency to thereby down convert the feedback frequency prior to application to the variable divider, another problem arises in using the above described time discriminator. If a narrow band intermediate frequency amplifier were used between the mixer and variable divider, either the system would be limited to narrow band applications, or it would be susceptible to disappearance of the feedback signal when the difference between the oscillator and reference frequencies is so large as to fall outside the intermediate frequency bandwidth. Upon loss of the feedback signal, the time discriminator frequency control loop would stop operation. Consequently, a wide band intermediate frequency amplifier and a high speed divider counter of substantial length would be required to provide continuous operation, two items which significantly add to cost and detract from reliability.

Another prior art automatic-frequency-control circuit for providing coarse adjustment of the voltage controlled oscillator is described in U.S. Patent No. 3,163,823. In this case both the feedback frequency from the variable divider and the reference frequency are applied to a digital frequency detector comprising two multivibrators under the control of a flip-flop, and an arrangement of output gates for providing control signals to the syntheto divider 14 through a relatively narrow band intermediate frequency (IF) amplifier 24. The reference oscillator and VCO output signals are both pulse trains; hence, variable divider 14 may comprise a binary ripple counter which is driven by the intermediate frequency pulse train from mixer 22. The speed of operation of the counter is determined by the frequency of the signal applied thereto from mixer 22 and the bandwidth of the IF amplifier 24; the channel selection capability is determined by the length of the counter, i.e. the number of bistable stages which comprise the divider ripple counter. The down converted and divided output of circuit 14 is then applied as the feedback signal to phase detector 12. The reference divider 18 may also comprise a binary ripple counter, in which case it is driven by the pulse train from reference oscillator 16.

To enable proper operation with the coarse tuning system of the invention, the phase detector is preferably of the commonly employed digital type which corrects the VCO toward a settled phase lock mode wherein the feedback pulses are interlaced in time with the reference pulses in an alternating one-to-one manner. A preferred phase detector for use in this application is the digital sampling type described in patent application, Ser. No. 505.684 filed Oct. 29, 1965 and assigned to the assignee of the present application. This digital sampling phase detector provides a control voltage-phase response range of 360° and an output control signal in which the alternating current ripple is significantly reduced. In contrast, the control voltage versus phase response of an analog phase detector is limited to a range of 90° or less of the reference signal, and the response of most digital phase detectors is limited to 180° of operation. Further, this particular type of phase detector extends the capture range of the phase lock loop to equal the control or tracking range.

When the phase control loop of FIG. 1 is phase locked, the frequency of the feedback signal applied to the phase detector is equal to the reference frequency provided by divider 18. The variable divider 14 divides the intermediate frequency from mixer 22 by a number N; thus, the output of mixer 22 must be N times the reference frequency in order for the feedback frequency to be equal to the reference frequency. Consequently, the frequency of the VCO less the frequency of reference oscillator 16 (i.e. the intermediate frequency from mixer 22) can be set to any multiple of the reference frequency from divider 18 by changing the division ratio of divider 14. If there is a phase difference between the reference and feedback signals, the phase detector generates a proportional direct current control voltage which is applied via low pass filter 20 as a phase error correction signal to the VCO to steer it towards the phase locked condition and the desired synthesizer frequency output.

In order to provide for wide frequency excursions which take the VCO out of its capture range due to a required change in frequency by the operator or because of changes in the VCO components as a result of environment, an automatic coarse tuning system 26 is included in the synthesizer to steer the VCO frequency within a range that will allow the phase detector to pull the system into phase lock. The coarse tuning system 26 comprises a digital comparator 28 having a first input connected to the feedback signal output of variable divider 14, and a second input connected to the reference signal output of divider 18. The output of compartor 28 is connected to the pulse drive input of a binary ripple counter 30. The parallel outputs of the stages of counter 30 are connected to a digital to analog converter 32, which consists of an arrangement of weighted resistors for converting each state of the counter to a corresponding analog voltage. Hence, the digital to analog convertor will be operative to generate a set of voltage levels each of which corresponds to the digital number stored in the counter at that instant in time. These voltage levels are applied as a frequency error correction signal to a control element of VCO 10, which may be the same control circuit to which the phase error signal is applied or a distinct control circuit.

Figure 2:
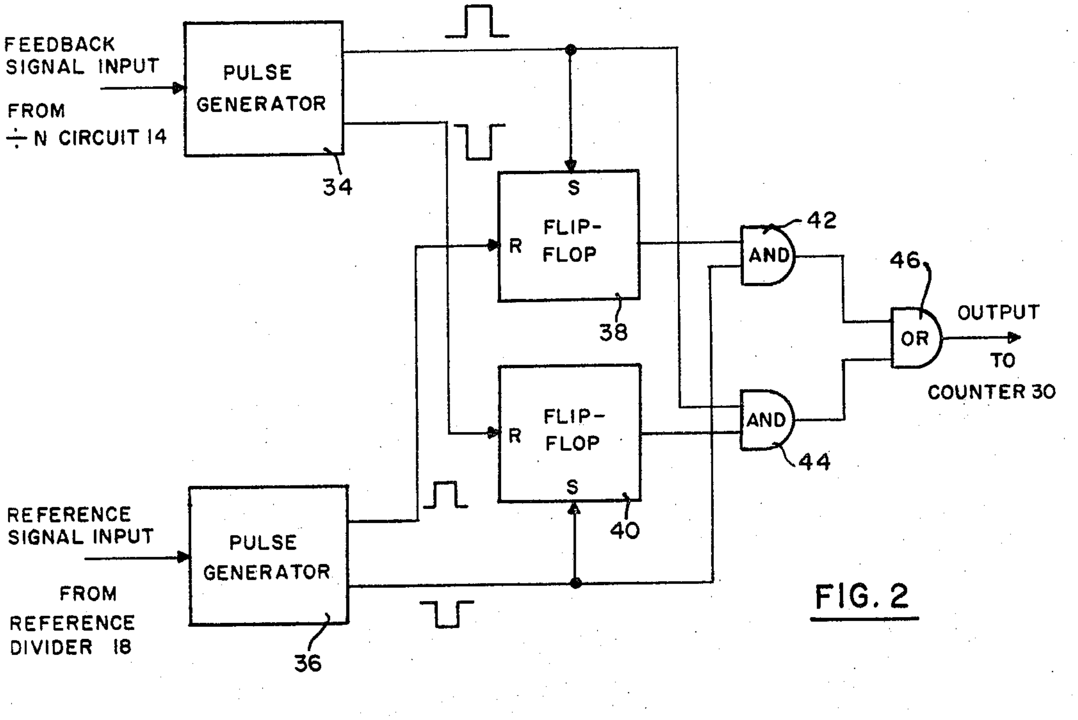

The digital phase comparator 28 is shown in greater detail in FIG. 2 and comprises a pair of pulse generators 34 and 36 each of which is operative in response to an input drive pulse to produce a pair of oppositely polarized output pulses, a pair of flip-flops 38 and 40, two AND gates 42 and 44, and an output OR gate 46. The inputs of pulse generators 34 and 36 are the two comparator inputs, the feedback signal pulse train from the divide-by-N circuit 14 being applied to the drive input of pulse generator 34 and the reference signal pulse train from reference divider 18 being applied to the drive input of pulse generator 36. The positive pulse output of pulse generator 34 is connected in parallel to the set input of flip-flop 38 and one input of AND gate 44, while the negative pulse output terminal of that pulse generator is connected to the reset input of flip-flop 40. The negative pulse output of generator 36 is connected to the set input of flip-flop 40 and one input of AND gate 42, while its positive pulse output is connected to the reset input of flip-flop 38. The other inputs of AND gates 42 and 44 are respectively connected to flip-flops 38 and 40 in a manner whereby each AND gate is inhibited when its associated flip-flop is in the set condition. The outputs of AND gates 42 and 44 are connected to the input of OR gate 46, the output of which is connected to the drive input of binary ripple counter 30.

In operation, the negative pulse produced by pulse generator 34 in response to an input feedback pulse triggers flip-flop 38 to the set condition to inhibit gate 42 from passing any pulses; this pulse is also fed to gate 44 to be passed therethrough unless blocked by the state of flip-flop 40. The trailing edge of the positive pulse from generator 34 resets flip-flop 40, thereby removing the inhibit on gate 44, and thus setting up a condition whereby the next negative pulse from generator 34 will appear at the output of gate 44 if no pulse is generated by pulse generator 36 between those two successive negative pulses from generator 34. This is true because a negative pulse from generator 36, produced in response to an input reference signal pulse, sets flip-flop 40 to thereby inhibit gate 44 and prevent the next negative pulse from generator 34 from appearing at the output of that AND gate. The generator 36 negative pulse output is also fed to AND gate 42 to be passed therethrough unless flip-flop 38 is in the set condition. The trailing edge of the positive pulse produced by generator 36 resets flip-flop 38 to remove the inhibit signal on gate 42 to allow the next negative pulse from generator 36 to be passed therethrough if flip-flop 38 is not triggered to the set condition by the occurrence of a negative pulse output from generator 34 between the two successive negative pulse outputs of pulse generator 36. Any pulses passed by AND gates 42 and 44 are combined together on one comparator output line by OR gate 46.

Figure 3:
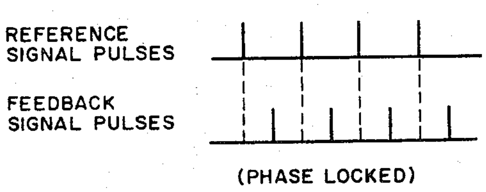

As has been previously mentioned, when the synthesizer is in phase lock or even approximately phase locked, the reference and feedback signal pulses produced by dividers 18 and 14, respectively, are interlaced in time in an alternating one-to-one manner, as illustrated in FIG. 3. In this pulse interlaced condition, the feedback and reference signals applied to the digital comparator (FIG. 2) are operative to set and reset flip-flops 38 and 40 in an alternating manner so that each of the AND gates 42 and 44 are inhibited at the time a pulse is applied to it. The result is that the comparator will generate no pulse output when the feedback and reference signals are so interlaced.

Figure 4:
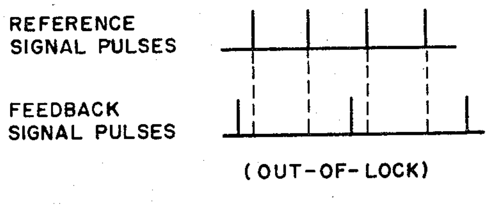

If the synthesizer frequency error becomes large due to a required change in frequency by the operator or because of changes in the VCO components as a result of environment, the frequency difference between the feedback and reference signals may well be in excess of the phase detector capture range so that the synthesizer loop would fall out of phase lock. The out-of-lock condition occurs when the frequency disparity between the reference and feedback signals is so large that the respective pulse trains from dividers 18 and 14 are no longer interlaced in a one-to-one alternating manner, as illustrated in FIG. 4. If the VCO frequency error is negative and the feedback signal frequency is much lower than the reference signal, two or more reference signal pulses will occur between each of the feedback signal pulses as shown in FIG. 4, a reverse situation occurring if the VCO frequency error is positive. When this condition occurs, the comparator generates output pulses at the difference frequency between the feedback and reference signals. For example, referring to FIGS. 2 and 4, each feedback pulse causes flip-flop 38 to be set, thereby blocking gate 42, and causes flip-flop 40 to be reset. The next pulse input to the comparator is on the reference signal input; this causes pulse generator 36 to produce a negative pulse which will be inhibited by gate 42, but it also produces a positive pulse, the trailing edge of which resets flip-flop 38. Consequently, the next pulse applied to the comparator, which in this instance is also at the reference input, triggers pulse generator 36 to generate a negative pulse which will be allowed through AND gate 42 and OR gate 46 to the comparator output. This last negative pulse also sets flip-flop 40, however, to thereby block the next negative pulse from generator 34 produced by a feedback pulse input. This process continues so as to generate an output pulse from the comparator in response to every other reference pulse applied to the comparator input. Hence, the output pulse train from the comparator is one-half the reference frequency in this illustration, this being the difference between the feedback and reference pulse trains, it being obvious from FIG. 4 that the reference signal pulses are illustrated as occurring at twice the rate of the feedback signal pulses.

Figure 5:
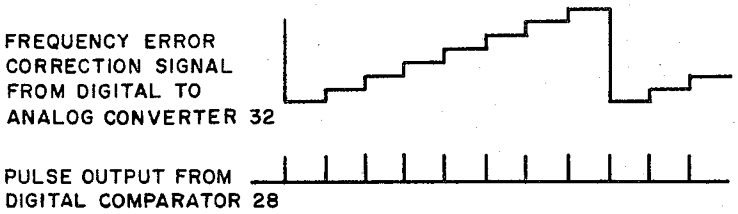

The binary ripple counter 30 is unidirectional, therefore, application of this pulse train from comparator 28 to drive the counter results in a set of voltage levels being generated from the digital to analog converter 32 which corresponds to this increasing count and presents an analog signal representative of the number of pulse generated by the comparator. More particularly, converter 32 produces a cyclic staircase waveform, as illustrated in FIG. 5. The number of voltage level increments comprising each cycle of this waveform is determined by the length of counter 30, i.e. the number of counter stages. Since it is this waveform that comprises the control signal output of the automatic coarse tuning system which is applied as a frequency error correction signal to VCO 10, the amplitude of this staircase waveform determines the frequency tuning range of the synthesizer. Assuming that the minimum voltage level of the staircase waveform represents the finimum frequency of the tuning range, the comparator pulses generated in the out-of-lock mode cause increasing voltage levels to be produced which steer the VCO until it approaches the desired output frequency. As this occurs, the reference and feedback signal frequency error decreases, thus reducing the comparator output pulse rate and allowing time for the phase detector to acquire phase lock. When phase lock occurs the reference and feedback frequency error is approximately zero, the comparator stops generating pulses, the digital to analog converter 32 holds the last output voltage level, and the phase detector provides all necessary error corrections.

Now suppose it is desired to change the synthesizer output to a much lower frequency level. If the frequency error is great enough to cause the synthesizer loop to fall out of phase lock, the automatic coarse tuning system will again take control. In this case, however, the output voltage levels from converter 32 increase until they reach the maximum level corresponding to the maximum frequency of the tuning range. The output of converter 32 will then drop to the minimum voltage level and the next staircase cycle is generated; that is, the coarse tuning system starts another search cycle from the minimum frequency level until it approaches the desired frequency, which as previously mentioned, is represented by a lower voltage level on the staircase waveform than the level at which the synthesizer was previously set.

This cyclic unidirectional search process has significant implementation advantages in that it permits the use of a relatively narrow band IF amplifier 24 and variable frequency divider 14; that is, variable division may be accomplished by a relatively low speed counter of minimal length. The reason for this is that if the frequency difference between VCO 10 and reference oscillator 16 is so large as to fall outside the IF bandwidth, and thereby result in no output from the variable frequency divider 14, the coarse tuning circuit 26 will still operate in response to the reference signal from divider 18 to continue frequency search by sweeping toward the maximum, and recycling from the minimum level again, if necessary, until the frequency difference is within the IF bandwidth. Hence, the present invention provides two very significant advantages over the prior art by eliminating the need for a high speed divider and providing useful coarse tuning control even when the feedback signal is lost.

The coarse tuning system 26 provides a very stable control loop in that the search process is referenced to a master oscillator source 16 and is completely digital; there is no timing monostable drift. The fact that the tuning system compares pulses rather than using a monostable delay network also provides a wider "window" in which to detect frequency error, a feature which results in faster loop response. A further advantage of the system is that it is compatible with present synthesizer designs and requires no modification of existing circuitry other than to connect the automatic coarse tuning loop into the synthesizer. The coarse tuning loop is independent of the phase detector operation other than for the interlacing requirement, and allows the phase detector to work continuously. Hence, the phase detector is required to operate over a very small range, thereby minimizing the tuning sensitivity of the phase detector and achieving a more noise free loop. In addition, it will be noted that the system has a variable frequency correction rate which is determined by the frequency error when the synthesizer is near phase lock and by the reference frequency signal when the loop is far from phase lock. As a result of the pulse comparison technique employed in the digital comparator 28, the coarse tuning loop can tolerate more error and acquire lock up more quickly than circuits which use time delay networks.

While the particular embodiment of the invention has been illustrated, it will be understood that the applicant does not wish to be limited thereto since modifications will now be suggested to one skilled in the art. For example, the coarse tuning system described is not limited in use to the type of indirect frequency synthesizer shown in FIG. 1. It can also be utilized with synthesizers which do not employ down conversion, but rather apply the VCO output to the variable divider directly or through fixed dividers. Also, in FIG. 2, it is clear that polarities can be reversed and that NAND and NOR circuits can be used in lieu of the AND and OR gates illustrated. Applicant, therefore, contemplates by the appended claims to cover all such modifications as fall within the true spirit and scope of his invention.

What is claimed is:

1. A tuning system for an oscillator adapted to be controlled in frequency by a signal applied thereto, said system comprising, in combination, a digital comparator having first and second inputs and an output, means for coupling a feedback signal from the output of said oscillator to the first input of said comparator, means for applying a reference signal to the second input of said comparator, and means coupled between the output of said comparator and said oscillator for providing a control signal to said oscillator in response to the output from said comparator, said feedback and reference signals comprising pulse trains, and said digital comparator being opeartive to generate output pulses when said feedback pulses are not interlaced in time with said reference pulses in an alternating one-to-one manner and to generate no pulse output when said feedback and reference signals are so interlaced.

2. A tuning system according to claim 1 wherein said means coupled between the output of said comparator and said oscillator comprises means for generating an analog signal representative of the number of pulses generated by said comparator.

3. A tuning system according to claim 2 wherein said digital comparator comprises first and second pulse generators each having a drive input and first and second pulse outputs, the drive inputs of said first and second pulse generators being the first and second inputs, respectively, of said comparator, and means operative in response to a pulse from the first output of said first pulse generator for preventing the next pulse from the first output of the second pulse generator from appearing at the output of said comparator, and operative in response to a pulse from the second output of said first pulse generator for allowing the next pulse from its first output to appear at the comparator output if no pulse is generated by the second pulse generator between those two successive output pulses of the first pulse generator.

4. A tuning system according to claim 3 wherein each of said first and second pulse generators is operative in response to an input drive pulse to produce a pair of oppositely polarized pulses at its respective first and second outputs, and wherein said last mentioned means comprises first and second flip-flops having trigger inputs connected to the outputs of said first and second pulse generators in a manner whereby said first flip-flop is set by a pulse from the first output of said first pulse generator and reset by a pulse from the second output of said second pulse generator and said second flip-flop is set by a pulse from the first output of said second pulse generator and reset by a pulse from the second output of said first pulse generator, a first AND gate having a first input coupled to the output of said first flip-flop and a second input coupled to the first output of said second pulse generator, a second AND gate having a first input coupled to the output of said second flip-flop and a second input coupled to the first output of said first pulse generator, each of said AND gates being inhibited from passing pulses when the flip-flop to which it is connected is in the set condition, and an OR gate having a pair of inputs respectively coupled to the outputs of said first and second AND gates, the output of said OR gate being the output of said comparator.

5. A tuning system according to claim 4 wherein said means coupled between said comparator and said oscillator for generating an analog signal representative of the number of pulses generated by said comparator comprises, a binary ripple counter having a pulse drive input and an output from which the digital number contained in said counter can be read, the output of said comparator OR gate being coupled to the drive input of said counter, and a digital to analog converter connected at the output of said counter for generating a set of voltage levels each of which corresponds to the digital number stored in the counter at that instant in time, said voltage levels being applied as the control signal for said oscillator.

6. In an indirect frequency synthesizer including an oscillator adapted to be controlled in phase and frequency by signals applied thereto, a digital sampling phase detector having first and second inputs and an output, a frequency divider coupled between the output of said oscillator and the first input of said phase detector for applying a feedback signal thereto, a reference frequency signal source connected to the second input of said phase detector, and a low pass filter connected between the output of said phase detector and said oscillator for providing a phase error correction signal to said oscillator in response to the output from said phase detector, said feedback and reference signals comprising pulse trains and said phase detector being operative to cause said oscillator to be phase corrected toward a condition wherein said feedback pulses are interlaced in time with said reference pulses in an alternating one-to-one manner, an automatic coarse tuning system for said oscillator comprising, in combination, a digital comparator having first and second inputs and an output, means coupling the output of said frequency divider to the first input of said comparator for applying said feedback signal thereto, means connecting said reference frequency signal source to the second input of said comparator, and means coupled between the output of said comparator and said oscillator for providing a frequency error correction signal to said oscillator in response to the output from said comparator, said digital comparator being operative to generate output pulses when said feedback pulses are not interlaced in time with said reference pulses in an alternating one-to-one manner and to generate no pulse output when said feedback an dreference signals are so interlaced.

7. A tuning system according to claim 6 wherein said digital comparator comprises first and second pulse generators each having a drive input and first and second pulse outputs, the drive inputs of said first and second pulse generators being the first and second inputs, respectively, of said comparator and each of said first and second pulse generators being operative in response to an input drive pulse to produce a pair of oppositely polarized pulses at its first and second outputs, first and second flip-flops having trigger inputs connected to the outputs of said first and second pulse generators in a manner whereby said first flip-flop is set by a pulse from the first output of said first pulse generator and reset by a pulse from the second output of said second pulse generator and said second flip-flop is set by a pulse from the first output of said second pulse generator and reset by a pulse from the second output of said first pulse generator, a first AND gate having a first input coupled to the output of said first flip-flop and a second input coupled to the first output of said second pulse generator, a second AND gate having a first input coupled to the output of said second flip-flop and a second input coupled to the first output of said first pulse generator, each of said AND gates being inhibited from passing pulses when the flip-flop to which it is connected is in the set condition, and an OR gate having a pair of inputs respectively coupled to the outputs of said first and second AND gates, the output of said OR gate being the output of said comparator.

8. A tuning system according to claim 7 wherein said means coupled between said comparator and said oscillator for providing a frequency error correction signal to the oscillator comprises, a binay ripple counter having a pulse drive input and an output from which the digital number contained in said counter can be read, the output of said comparator OR gate being coupled to the drive input of said counter, and a digital to analog converter connected at the output of said counter for generating a set of voltage levels each of which corresponds to the digital number stored in the counter at that instant in time, said voltage levels being applied as the frequency error correction signal for said oscillator and said counter being unidirectional so that said frequency correction signal is a cyclic staircase waveform wherein the number of discrete voltage levels comprising a cycle is determined by the length of said counter and the amplitude of said staircase waveform determines the frequency tuning range of said coarse tuning system.

No references cited.

JOHN KOMINSKI, *Primary Examiner.*